United States Patent [19]

Sorger et al.

[11] Patent Number: 4,555,683

[45] Date of Patent: Nov. 26, 1985

[54] MAGNETICALLY TUNABLE RESONATORS AND TUNABLE DEVICES SUCH AS FILTERS AND RESONANT CIRCUITS FOR OSCILLATORS USING MAGNETICALLY TUNED RESONATORS

[75] Inventors: Gunter U. Sorger, Menlo Park; Dan Raicu, Sunnyvale, both of Calif.

[73] Assignee: Eaton Corporation, Cleveland, Ohio

[21] Appl. No.: 574,847

[22] Filed: Jan. 30, 1984

[51] Int. Cl.$^4$ .................... H01P 1/217; H01P 7/00
[52] U.S. Cl. ................ 333/202; 333/24.1; 333/205; 333/235
[58] Field of Search .............. 334/4; 333/202, 204, 333/205, 206, 207, 219, 222, 223, 235, 17 L, 24.1, 24.2; 324/300, 313; 331/107 DP, 107 SL

[56] References Cited

U.S. PATENT DOCUMENTS

| | | | |
|---|---|---|---|
| 3,100,288 | 8/1963 | Schloemann | 333/24.2 |
| 3,246,263 | 4/1966 | Clark | 333/24.1 |
| 3,252,111 | 5/1966 | Muller | 324/300 X |
| 3,409,823 | 11/1968 | Czerlinsky et al. | 333/24.1 X |
| 3,444,484 | 5/1969 | Bierig | 333/24.1 X |
| 4,197,517 | 4/1980 | Vittoria | 333/235 X |

OTHER PUBLICATIONS

Nicolaas Bloembergen, "Proceedings of the IRE", 10/56, pp. 1259–1269.
Joseph O. Artman, "Proceedings of the IRE", 10/56, pp. 1284–1293.
Matthaei, Young, Jones: "Microwave Filters, Impedance Matching Networks and Coupling Structures", McGraw Hill, 1964, p. 1036.
W. H. von Aulock, "Handbook of Microwave Ferrite Materials", Academic Press, 1965, pp, 80–81 and 88–89.
R. E. Tokheim, "IEEE Transactions on Magnets", vol. Mag-7, No. 2, pp. 267–276, Jun. 1971.
M. S. Sodha, N. C. Serirastawa, "Microwave Propagation in Ferrimagnetics", Plenium Press, NY, London, 1981, pp. 28–29.
Young et al., *A500-to-1000 Mhz Magnetically Tunable Bandpass Filter Using Two YIG-Disk Resonators*, IEEE Transs. on MTT, Feb. 1967, pp. 72–86.
Simpson et al., *Tunable Microwave Filters Using YIG Grown by Liquid Phase Epitaxy*, 4th European Microwave Conference, Sep. 1974, pp. 590–594.

*Primary Examiner*—Paul Gensler
*Attorney, Agent, or Firm*—Amster, Rothstein & Engelberg

[57] ABSTRACT

Resonators magnetically tunable over a broad rf frequency range capable of operation at relatively low rf frequencies (VHF band) are disclosed as well as tunable devices based on them. The resonators comprise a resonator body made of a ferrimagnetic single-crystal material which is generally flat, and is generally rotationally symmetrical with respect to an axis of rotation, for example disk-like or oblate spheroidal-like. The axis of rotation of the resonator body is oriented with respect to the crystalline lattice in a particular way depending on the anisotropy. The same orientation is required for the dc field whose magnitude determines the resonance frequency. The resonators are particularly useful in broadband tunable rf and microwave filters and oscillators, and can be tuned by means of the dc field to resonate from about 50 MHz to several GHz.

26 Claims, 17 Drawing Figures

LOCI OF ADMISSIBLE ORIENTATION OF MAGNETIZATION FOR VERY LOW RESONANT FREQUENCY OPERATION

ENLARGED AREA OF FIG. 1, CLOSE TO A [111] AXIS

TOLERANCES IN ORIENTATION OF THE dc FIELD WITH RESPECT TO THE CRYSTAL AXES FOR NEGATIVE ANISTROPY

TOLERANCES IN ORIENTATION OF THE dc FIELD WITH RESPECT TO THE CRYSTAL AXES FOR POSITIVE ANISTROPY

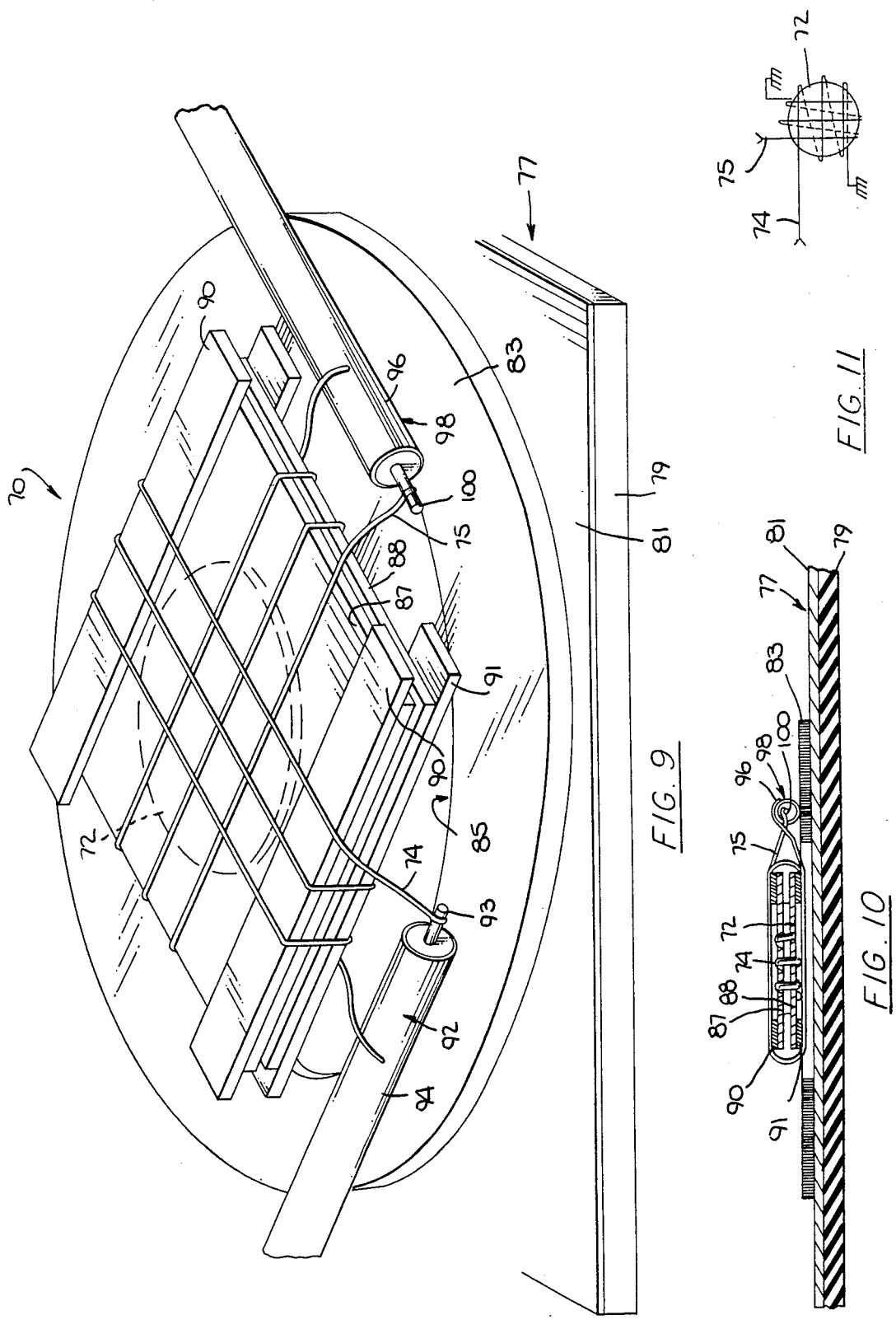

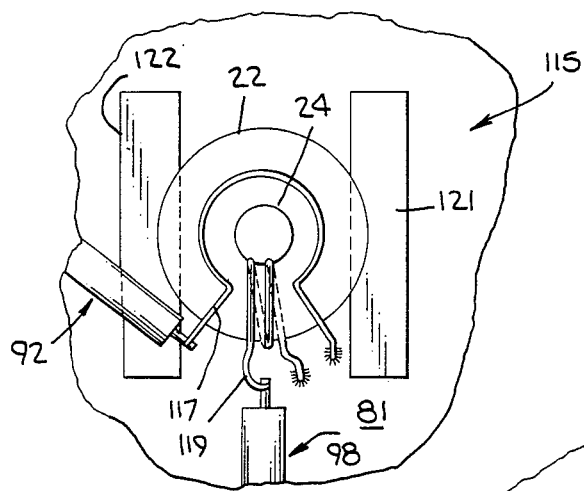
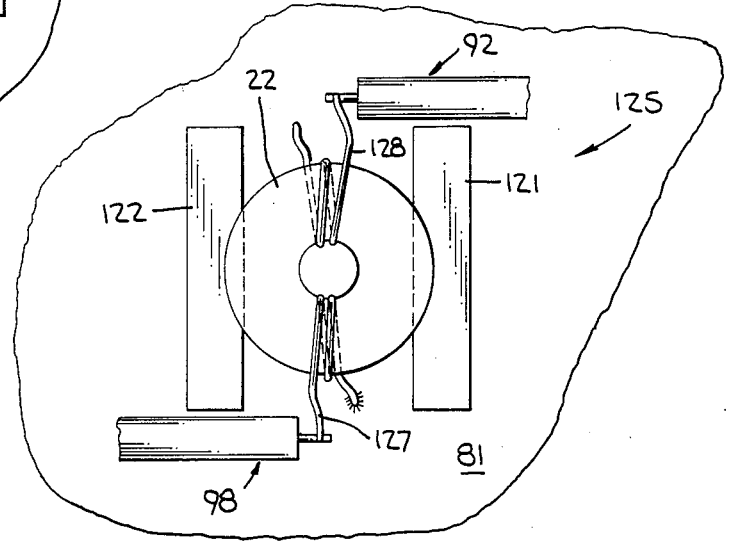
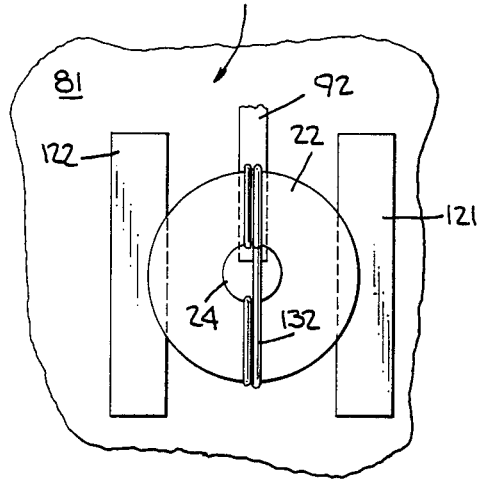
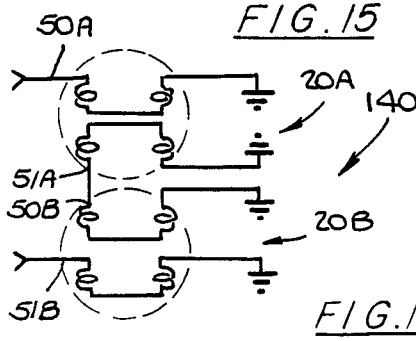
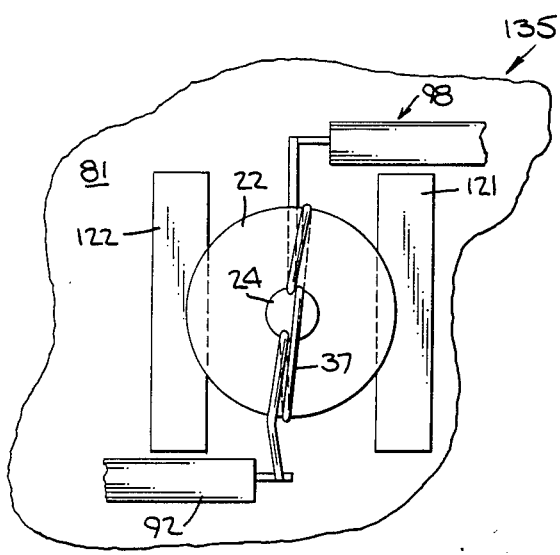
FIG.13
FIG.14
FIG.15
FIG.17
FIG.16

MAGNETICALLY TUNABLE RESONATORS AND TUNABLE DEVICES SUCH AS FILTERS AND RESONANT CIRCUITS FOR OSCILLATORS USING MAGNETICALLY TUNED RESONATORS

BACKGROUND OF THE INVENTION

The present invention relates to broadband magnetically tunable resonators and to tunable devices using such resonators such as filters, particularly bandpass and band reject filters, oscillators and other devices. The resonators disclosed herein and the devices in which they are used are tunable generally over a broad frequency range extending from VHF to microwave.

Magnetically tunable resonators operated at radio frequencies, particularly microwave frequencies, employ resonator bodies made of a ferrimagnetic material. Such resonator bodies are usually spherically-shaped, made of single-crystal YIG (yttrium-iron-garnet), nickel ferrite, lithium ferrite, etc., materials and operated in the uniform precessional mode ((100)-mode. Known resonators, using such resonator bodies and suitable coupling arrangements, with proper design techniques, can be tuned to resonate over a frequency range in excess of 10:1. However, the minimum resonance frequency at which known magnetically tunable resonators can be tuned at a reasonably high Q and for a reasonably large signal level has been limited to about 1000 MHz or more, depending on the magnetic material. So far as the applicants are aware, efforts to lower the minimum resonance frequency of such tunable magnetic resonators have been unsuccessful.

The existence of a lower limit for the resonance frequency of ferrimagnetic resonators, is however, well known, and it was commonly accepted that this lower limit is related to what are known as demagnetizing effects. A convenient starting point for an analysis of the basis for the lower frequency limit of ferrimagnetic resonators is the equation for the internal field (Hi) in a saturated ferrimagnetic body, $$H_i = H_{dc} - N_z(4\pi M_s),$$  (Expression 1)

where: $H_{dc}$ is the applied static magnetic field, oriented along the z-axis of a rectangular coordinate system, measured in Oersteds; $N_z$ is the demagnetizing factor in the z direction (direction of the $H_{dc}$ field); and $90M_s$ is the saturation magnetization measured in Gauss.

The relationship of Expression 1 assumes that the saturation magnetization is parallel to the applied external field; that is, the external field is strong enough not only to move the "Bloch" walls away so that the body is uniformly magnetized, but also to turn the magnetization into the direction of the external field.

The demagnetizing factors in the x, y and z directions, i.e. $N_x$, $N_y$ and $N_z$, respectively, are related by:

$$N_x + N_y + N_z = 1.$$  (Expression 2)

For a body with circular symmetry about the z axis, the two demagnetizing factors $N_x$ and $N_y$, which are transverse to $N_z$, are equal, and each is referred to as $N_t$, which leads to:

$$N_z + 2N_t = 1.$$  (Expression 3)

The resonance frequency "fo" in MHz of a ferrimagnetic body with circular symmetry in terms of the magnetic field in Oersteds is given by:

$$fo = 2.8[H_{dc} - (N_z - N_t)4\pi M_s]\text{MHz}.$$  (Expression 4)

As indicated above, Expression 3 applies to a resonator body with circular symmetry, where $N_t$ is the demagnetizing factor in the direction transverse to $H_{dc}$ (i.e., transverse to the internal field $H_i = H_z$, and transverse to the saturation magnetization). The factor "2.8" is the gyromagnetic ratio for a ferrimagnetic body having circular symmetry and equals $ge/2mc_o$, where e is the charge of an electron, m is the mass of an electron, g is the gyromagnetic factor for a ferrimagnetic body and $c_o$ is the speed of light in a vacuum.

In order to obtain good resonance (reasonably high Q, and no limiting with reasonably high signal levels), the ferrimagnetic body must be saturated. This can only happen if the internal field $H_i$ is larger than zero.

From the above relationships, the minimum resonance frequency "fo min" of a body with circular symmetry can be determined to be:

$$fo\ \text{min} = 1.4(1 - N_z)4\pi M_s\ \text{MHz}.$$  (Expression 5)

For a sphere, since $N_z = \frac{1}{3}$, the equation for the minimum frequency reduces to:

$$fo\ \text{min} = 0.93\ 4\pi M_s\ \text{MHz}.$$  (Expression 6)

If the ferrimagnetic body is made of pure YIG material, $4\pi M_s$ is about 1750 Gauss, resulting in a minimum resonance frequency of about 1630 MHz. By reducing $4\pi M_s$ (by, for example, doping YIG material with gallium, and/or by heating the ferrimagnetic material to a temperature close to the Curie point), the minimum resonance frequency can be reduced to 1000 MHz, or even lower, at the expense of lower Q, lower signal limiting level and higher resonance frequency/temperature sensitivity.

So far as the demagnetizing effects are concerned, it was thought that the minimum resonance frequency of a ferrimagnetic resonator body could be lowered if a disk-like shape were used instead of a sphere. Taking a disk-like shape (e.g. a flat ellipsoid) for the resonator body, with the static magnetic field $\bar{H}_{dc}$ applied normal to the large surfaces of the disk-like body, the demagnetizing factors $N_x$, $N_y$, and $N_z$ change, with $N_z$ getting larger, and $N_x$ and $N_y$ getting smaller ($N_x$ is equal to $N_y$ since circular symmetry exists for a disk-like shape as well as for a sphere). For a disk-like shape having a diameter-to-thickness ratio of 30:1, $N_z$ is about 0.95, and $N_x$ and $N_y$ each are 0.025. For such a disk-like shape, theoretically, the minimum resonance frequency given by Expression 5 decreases to 0.07 $4\pi M_s$, which for a pure YIG material is about 123 MHz and for a gallium-doped YIG material, can be less than 50 MHz.

Experimentally, however, even using disk-like shapes, it was, so far as applicants are aware, not possible to reach the low resonance frequencies which appeared theoretically possible from Expression 5. In fact, Matthaei et al. (Matthaei, G. L., Young, L., Jones, E.M.T., "Microwave Filters, Impedance Matching Networks and Coupling Structures", McGraw Hill, N.Y., 1964, p. 1036) state: "In theory, by using flat, disk-like ellipsoidal shapes, the minimum resonance frequency could be reduced greatly. However, in practice, disk-shaped resonators do not appear to work very well, possibly because of the difficulty in obtaining disk-like resonators that are sufficiently perfect ellipsoids."

OBJECTS OF THE INVENTION

It is an object of the present invention to reduce the minimum resonance frequency of magnetically-tunable, radio frequency resonators, particularly those made of ferrimagnetic materials.

It is another object of the present invention to provide improved magnetically-tunable radio frequency resonators, particularly those made of ferrimagnetic materials.

It is another object of the present invention to provide a magnetically-tunable, radio frequency ferrimagnetic resonator having a low minimum resonance frequency of, for example, about 50 MHz.

It is another object of the present invention to provide a magnetically-tunable, radio frequency ferrimagnetic resonator having a low minimum resonance frequency of, for example, about 50 MHz, which can be tuned over a broad frequency range up to several thousand MHz.

It is still another object of the present invention to provide improved devices such as filters, resonant circuits and other devices utilizing the resonators described in the foregoing objects.

SUMMARY OF THE INVENTION

The applicants have discovered that it is indeed possible to lower the low resonance frequency limit of ferrimagnetic resonators, and the applicants describe herein the cause they discovered for the apparent discrepancy between theory and practice for the low frequency limit of ferrimagnetic resonators. In addition, the applicants describe herein how this cause can be eliminated and disclose resonators capable of achieving a lower resonance frequency than heretofore possible with acceptable Q and limiting levels, and devices utilizing such resonators.

The applicants recognized that there is a limitation relating to the minimum resonance frequency of a resonator body made of a single-crystal ferrimagnetic material in addition to that given by Expression 5, which is the effect of the crystalline anisotropy of the ferrimagnetic material. The applicants discovered that it was theoretically possible to obtain a resonance frequency which approached zero, so far as the effects of crystalline anisotropy are concerned, for a single-crystal ferrimagnetic resonator body for particular values of the applied field $\vec{H}_{dc}$ by aligning the body so that the applied field lies along particular crystallographic directions in accordance with the crystal anisotropy (positive or negative).

For spherically-shaped bodies of single-crystal ferrimagnetic materials, the applicants recognized that the limiting effect of crystalline anisotropy can be overcome to reduce the minimum resonance frequency, but that the limit on the minimum resonance frequency given by Expression 6 still remained. However, by taking the limiting effect on minimum resonance frequency of the crystalline anisotropy of the ferrimagnetic material into consideration, the applicants discovered that it was possible to lower the minimum resonance frequency of a ferrimagnetic resonator body if a shape other than spherical is used for the resonator body, if this non-spherically-shaped body is oriented in a particular way relative to the crystal lattice and if the non-spherically-shaped body is appropriately aligned in the field.

One reason that single-crystal ferrimagnetic resonators were not heretofore reported to resonate below about 1000 MHz with acceptable Q and signal limiting levels was attributed by the applicants to the failure of others to properly consider the effect of crystalline anisotropy. On the other hand, the applicants recognized that prior calculations for resonance frequencies in anisotropic ferrimagnetic materials (see, for example, *Artman* "Microwave Resonance Relations in Anisotropic single-Crystal Ferrites", "Proc. IRE", October 1956) were much too narrow in scope (i.e., they applied only to saturated spherical resonator bodies and they applied only for the internal H field lying within one particular crystal plane) to suggest that it was possible to obtain a very low ferrimagnetic resonance frequency (<100 MHz) by applying an external magnetic field to a resonator single-crystal body having a shape other than spherical and oriented in a particular way relative to the crystal lattice, and appropriately aligning the body in the dc field.

According to applicant's invention, the minimum resonance frequency of a ferrimagnetic material can be lowered considerably by providing the single-crystal ferrimagnetic in a body having a generally flat, circularly-outlined shape, and having a particular crystallographic configuration. A generally flat, circularly-outlined shape is used herein in a broad sense and can include a generally oblate spheroid, a generally flat ellipsoid, a disk, a disk with rounded or bevelled edges, a toroid, a lens, a washer, etc. Thus, bodies having such shapes have rotational symmetry with respect to an axis of rotation. The term "flat" is also used herein in a broad sense, and encompasses shapes having opposed surfaces which can be planar and/or have a curvature, and in which the axial dimension is small compared with the diameter, i.e. the diameter to axial dimension or thickness ratio being in and adjacent the range of from about 50:1 to about 10:1. The ferrimagnetic body can be provided with (or without) an opening or hole through the body, and such a hole can also have bevelled edges. The axis of rotation of such generally flat, circularly-outlined ferrimagnetic bodies is in a particular orientation with the crystalline lattice of the ferrimagnetic materials, as described herein. The invention takes into consideration the demagnetizing effects for a generally flat and circularly-outlined ferrimagnetic body, as opposed to the demagnetizing effects for a sphere. The invention thus makes possible a minimum resonance frequency close to zero of such a ferrimagnetic body when it is appropriately aligned in a dc field.

With suitable coupling arrangements, some of which are described herein, filters and resonant circuits, for example, tunable over broad radio frequency ranges with a minimum resonance frequency of about 50 MHz can be provided.

Background Development—Effect Of Crystalline Anisotropy At Low Frequencies For A Spherical Resonator The applicants in recognizing the shortcomings of earlier theory extended the theory to generally flat resonators of circular outline shape (e.g. a disk-like configuration) for all possible orientations of the dc magnetic field (not necessarily in the (110) plane).

While the applicants discovered from a study of the above expressions that it might be possible to lower the minimum resonance frequency of a resonator body made of a ferrimagnetic saturated material by utilizing a configuration other than a sphere, the applicants recognized that the effect of crystalline anisotropy set a limit independent of the use of such other configurations. Therefore, so far as applicants are aware, a ferrimagnetic resonator was not heretofore successfully implemented at resonance frequencies as low as about 100 MHz with low insertion loss, high Q, relatively high signal limiting levels, and resonances essentially free of higher order magnetostatic resonance modes. The main reason for this, as indicated above, was attributed by the applicants to the failure of others to properly consider the effect of the crystalline anisotropy of the ferrimagnetic resonator body.

Heretofore ferrimagnetic resonator bodies were often magnetically aligned in such a way that the temperature sensitivity of the resonance frequency (at a constant external field) was minimized. If the resonator body is sphere-shaped (as in practically all ferrimagnetic filters heretofore), the three demagnetization factors $N_x$, $N_y$ and $N_z$ become equal, i.e., each is one-third. The expression for the resonance frequency (Expression 4) simplifies to:

$$f_0 = 2.8 \times H_{dc} \text{ MHz,} \tag{Expression 7}$$

if anisotropy is negligible.

The general principle that the magnetization of a single-crystal ferrimagnetic resonator body is affected by its crystalline nature is known. See, for example, Kittel, "On the Theory of Ferromagnetic Resonance Absorption", "Phys. Review", Vol. 73, pp. 155–161, January 1948. In Kittel, the effect of crystalline magnetic anisotropy on the relationship between the applied external field and the ferromagnetic resonance is considered by adding an "anisotropy field" as follows.

the diagonal crystal axes (the [111] axes) are directions of "hard" magnetization.

For single-crystal materials (having cubic symmetry) with a negative first order anisotropy factor $K_1$, the diagonal crystal axes are directions of "easy" magnetization, and the [100], [010], [001] axes are directions of "hard" magnetization. YIG (and Ga/substituted YIG) materials have a negative $K_1$. LiFe also has a negative $K_1$, but which is 15 times larger than that of a pure YIG material. The magnitude of $K_1$ for pure YIG, Ga substituted YIG, and LiFe materials decreases with increasing temperature.

If the external field is sufficiently large (which it is at radio frequencies in and adjacent to the microwave frequency range) so that the single-crystal resonator body is magnetically saturated, the anisotropy field is equal to $2K_1M_s$ (Oersteds), where $M_s$ is the resonator saturation magnetization. Although $M_s$ also decreases with increasing temperature, the anisotropy field still decreases rapidly with increasing temperatures, causing the resonance frequency to change with ambient temperature. For further discussion of $K_1M_s$, see Aulock, "Handbook of Microwave Ferrite Materials", Academic Press, 1965, pp. 88–89.

If the resonance frequency is much larger than $2.8(|K_1/M_s|$ MHz, it is possible to eliminate to a first order the effect of the anisotropy on the resonance frequency nearly independently of the frequency by orienting the spherically-shaped single-crystal resonator body inside the external magnetic field in a specific way. When the spherically-shaped single-crystal body is oriented in such a way that a (110) plane is parallel to the external magnetic field (and to the internal magnetization if $H_{dc}$ is sufficiently large), the $N_x^a$, $N_y^a$, and $N_z^a$ anisotropy demagnetizing factors can be calculated as a function of the angle $\theta$ which the internal field forms with the [100] crystal axes. This calculation is given in Bloembergen, "Magnetic Resonance in Ferrites", "Proc. IRE", October, 1956, p. 1259.

$$f_0 = 2.8 \sqrt{[H_{dc} + (N_y + N_y^a - N_z - N_z^a)4\pi M_s][H_{dc} + (N_x + N_x^a - N_z - N_z^a)4\pi M_s]} \text{ MHz} \tag{Expression 8}$$

In Expression 8, $H_{dc}$ is the external applied field (in the z direction) in Oersteds;

$4\pi M_s$ is the saturation magnetization (also in the z direction) in gauss;

$N_x$, $N_y$, $N_z$ are the geometrical demagnetizing factors;

$N_x^a(4\pi M_s)$ is the x component of anisotropy field;

$N_y^a(4\pi M_s)$ is the y component of anisotropy field; and $N_z^a(4\pi M_s)$ is the z component of anisotropy field.

However, this relatively simple expression is only true when the magnetization M is parallel to the applied field $H_{dc}$.

Expression (8) shows that the anisotropy field appears as an effective demagnetizing field. This anisotropy field is directly related to $K_1/M$, where $K_1$ is the first order anisotropy constant of a ferrimagnetic crystal. If the anisotropy constant $K_1$ expressed in ergs/cm$^3$ is divided by M expressed in Gauss, the ratio $K_1/M$ is expressed in Oersteds. Thus, $K_1/M$ has the dimension of a magnetic field.

For single-crystal materials having cubic symmetry with a positive first order anisotropy factor $K_1$, the [001], [010], and [100] axes of the crystal are directions of "easy" magnetization. An "easy" magnetization requires the smallest applied external field in order to magnetize the single crystal completely. Conversely, Neglecting the second order anisotropy effects (i.e. setting the second order anisotropy factor $K_2=0$, since it is very small compared to $K_1$), and neglecting the anisotropy product terms, at the angle $\theta=29.7°$ (equivalent to the [225] direction), the influence of the anisotropy disappears and the expression for the resonance frequency for a spherically-shaped resonator body simplifies to expression 7, which is only a first order approximation. As stated in Tokheim, "IEEE Transactions on Magnetics", June 1971, pp. 267–276, if the anisotropy product terms are not neglected, the residual angular difference between the internal field $H_i$ and the magnetization $\overline{M}$, the cavity wall pulling, and the sphere asphericity are considered, the resonance frequency/temperature compensation becomes dependent on $H_{dc}$, and is therefore frequency dependent, but only as a second-order effect.

However, as indicated above, elimination of the effects of the anisotropy field on frequency applies only to resonance frequencies which are much larger than $2.8(|K_1|/M_s)$ MHz, (which for pure YIG and Ga substituted YIG materials is much higher than 150 MHz). Thus, if the resonator is to be tunable to frequencies below a few hundred MHz, the first order approximation of Expression 7 does not apply and a much more rigorous calculation of the relationship between resonance frequency and applied H-field is necessary.

If the applied field strength $H_{dc}$ decreases to the same order of magnitude as the anisotropy field, the magnetization $\vec{M}$ is no longer parallel to the internal field $\vec{H}$, which invalidates the basis for the approximation given in Expression 8. In Artman, the relationship between the resonance frequency $\omega$ and magnetization M in a sphere with the magnetic field H applied so that it lies in a (110) plane was calculated. In order to express the resonance frequency $\omega$ as a function of the applied field $\vec{H}_{dc}$, Artman developed a tensor $\vec{X}$ which relates the microwave magnetization to the applied external microwave field. Artman greatly simplified his calculations by confining them to the (110) plane and assuming a spherically-shaped resonator body, where the internal dc field is parallel to the external dc field $H_{dc}$.

Artman's results expressed the relationship between the resonance frequency of a spherically-shaped ferrimagnetic body and the magnitude of the applied field, the character of the anisotropy (positive or negative) and the orientation of the internal field with respect to the [100] axis. No attempt was made to cover the general case, when the magnetic field is arbitrarily oriented with respect to the crystal lattice, to identify the conditions under which the resonance frequency can reach zero, or to extend the analysis for other shapes than spheres. In fact, the purpose of Artman's paper was not an analysis of low frequency resonance but rather the effect of strong anisotropy in the usual range of resonance frequencies, where spherically-shaped bodies can be used without difficulty.

Applicants' Calculations for a Disk-shaped Resonator (a) Effects of Anisotropy

Considering a cubic single-crystal material (either YIG or other ferrite), cubic symmetry is characterized by interchangeability of the three coordinate axes parallel to the cube edges. Any direction is therefore equivalent to any other whose angles to the three axes have the same values in a different order. An elementary symmetry domain whose study gives an exhaustive image of the phenomena related to the anisotropy is one for which the angles $\Psi_j$ with the axes $x_j$ satisfy a relation of the type:

$$0 \leq \Psi_1 \leq \Psi_2 \leq \Psi_3 \leq \pi/2 \quad \text{(Expression 9)}$$

In a spherical system of coordinates this becomes, for example, $$\sin\theta\sin\phi \geq \sin\theta\cos\phi \geq \cos\theta \geq 0. \quad \text{(Expression 10)}$$

In a saturated crystal, the magnetization is produced by an equivalent dc field parallel to it. This field $H_o$ is related to the internal dc field $H_i$ by the relation $$\vec{H}_o = \vec{H}_i + \vec{H}_{AO}, \quad \text{(Expression 11)}$$

where $\vec{H}_{AO}$ is the dc part of the anisotropy field, defined as $$\vec{H}_{AO} = \frac{-1}{M_o} \nabla \alpha U_A, \text{ and} \quad \text{(Expression 12)}$$

where $\nabla\alpha \, U_A$ is the gradient of the anisotropy energy with respect to the components of the unit vector parallel to the magnetization.

For cubic ferrimagnetics:

$$U_a = K_1(\alpha_1{}^2\alpha_2{}^2 + \alpha_2{}^2\alpha_3{}^2 + \alpha_3{}^2\alpha_1{}^2), \quad \text{(Expression 13)}$$

where $K_i$ are the projections on the axes of the vector $\vec{\alpha}$. Consequently, $$\vec{H}_{AO} = -\frac{2K_1}{M_o}(\Sigma\alpha_i\vec{x}_i - \Sigma\alpha_i{}^3\vec{x}_i). \quad \text{(Expression 14)}$$

If the magnetization vector has a direction given in spherical coordinates by the angles $\theta$ and $\phi$ which, without sacrificing generality, are assumed to satisfy Expression 10, then $$H_{ij} = H_{oj} + \frac{2K_1}{M_o}\alpha_j - \frac{2K_1}{M_o}\alpha_j{}^3. \quad \text{(Expression 15)}$$

Normalizing the magnetic field $h = H\,M_o/2|K^o{}_1|$ and denoting $S = K_1/|K_1|$, in sperical coordinates, the following expressions are obtained.

$$h_{ix} = \cos\phi\sin\theta[h_o + S(1-\cos^2\phi\sin^2\theta)]$$

$$h_{iy} = \sin\phi\sin\theta[h_o + S(1-\sin^2\phi\sin^2\theta)]$$

$$h_{iz} = \cos\phi[h_o + S\sin^2\theta)] \quad \text{(Expression 16)}$$

The vector $\vec{h}_i$ has $\phi_i$ and $\theta_i$ coordinates satisfying Expression 10 which sets a minimum value of the effective dc field $h_o$ which can be obtained along the direction $(\theta,\phi)$. For positive anisotropy: $S=1$. For any value $h_o \geq 0$, from Expression 16, $h_{ix} \geq 0$, $h_{iy} \geq 0$, $h_{iz} \geq 0$. However, the inequalities $h_{iz} \geq h_{ix} \geq h_{iy}$ imply relationships of the following type.

$$M(h_o+1-M^2) \geq N(h_o+1-N^2), \text{ if } M \geq N. \quad \text{(Expression 17)}$$

From Expression 17 one obtains $$h_o + 1 \geq M^2 + MN + N^2, \quad \text{(Expression 18)}$$

which is more restrictive the greater M and N are.

Taking, therefore, the first terms from the chain of inequalities of Expression 10, $$h_o + 1 \geq \sin^2\theta(1 + \sin\phi\cos\phi) \quad \text{(Expression 19)}$$

is obtained which yields $$h_o \geq -\cos^2\theta + \sin^2\theta\sin\phi\cos\phi. \quad \text{(Expression 20)}$$

For negative anisotropy, $S = -1$ and Expression 17 is replaced by a condition of the type $$M(h_o-1+M^2) \geq N(h_o-1+N^2), \text{ for } M > N, \quad \text{(Expression 21)}$$

from which is obtained $$h_o \geq 1 - MN - M^2 - N^2 \quad \text{(Expression 22)}$$

In this case, however, the critical limitation is given by the conditions $h_{ij} \geq 0$ for $h_{oj} \geq 0$. Choosing again the most severe case, one obtains $$h_o - 1 \geq -\cos^2\theta$$

$$h_o \geq \sin^2\theta. \qquad \text{(Expression 23)}$$

Denoting the normalized frequency $\Omega = \omega/(\gamma^2 |K_1|/M_o)$ and slightly transforming Equation (1.77) from M. S. Sodha and N. C. Srivastava, "Microwave Propagation in Ferrimagnetics" Plenum Press, N.Y. London, 1981, page 29, the resonance frequency "$\Omega_r$" is given by $$\Omega_r^2 = 9[x^2 - 2Sx\sin^2\theta(\sin^2\theta\sin^2\phi\cos^2\phi + \cos^2\theta) + 3\sin^4\theta\cos^2\theta\sin^2\phi\cos^2\phi]. \qquad \text{(Expression 24)}$$

In Expression 24, the variable $x = h_o + S/3$ has been introduced. To find the conditions for obtaining the lowest possible resonance frequencies, $\Omega_r$ is set equal to 0 in Expression 24, which yields two solutions for X which generally contradict the conditions in Expressions 9 or 23 respectively, except for the following particular cases.

For negative anisotropy, $\phi = \pi/2$: Extending this condition from the elementary domain considered, to the whole range or spherical coordinates, it defines the orientations of the magnetization lying in or parallel to a plane (100).

For positive anisotropy: One of the roots of Expression 24 is acceptable with regard to the inequality in Expression 20 for $\phi = \pi/4$. Again, extending the conditions over the entire sphere, it describes orientations of the magnetization vector lying in or parallel to a (110) plane in the interior of the angle between two [111] axes separated by one [110] axis, i.e. inside the acute angle formed by two [111] axes.

For positive anisotropy, the maximum root of Expression 24 satisfies the condition in Expression 20 for orientations covering a narrow domain close to $\phi = \pi/4$, for values of $\theta$ close to $\theta = 54°44'$, that is, close to the [111] axis. Such orientations of the magnetization may arise only for an applied field of the proper value applied extremely close to the [111] axis. Practically, the extension of the range described by the equality of $\phi = \pi/4$ can be neglected, and technically, using this extension seems hardly feasible. This possibility has been mentioned, therefore, for the sake of completeness and further consideration will be limited to the situations previously mentioned.

FIG. 1 shows the loci of the intersections between a unit sphere of coordinates and the orientations in which the magnetization vector can lie in order for a zero frequency resonance to be theoretically achievable. The solid lines define circles having a diameter equal to that of the sphere, parallel to 100 type planes, extending about the sphere and separated by 90° and represent the admissible orientations for the case of negative anisotropy. The dashed and dotted lines together also define circles having a diameter equal to that of the sphere, extending about the sphere separated from each other by 90° and separated from the solid line circles by 45°. The dashed line portions of the dashed and dotted line circles represent the admissible orientations for the case of positive anisotropy. In FIG. 2, a detail close to the [111] axis is represented, showing the domain where the second root of Expression 24 can comply to the condition of Expression 20. It must be kept in mind that in order to have the magnetization within this domain with the proper value of $h_o$, the internal field $h_i$ should be much closer to the [111] axis, that is, within an even smaller subdomain.

It is theoretically indifferent which of the allowed orientations of magnetization are chosen, and using Expression 16, the magnitude and the orientation of the internal dc field which would create it can be found. However, it is important from a technical viewpoint to select an orientation which is less sensitive to slight misorientations of the crystal which exist for a real sample. In FIGS. 3 and 4, two spherical polygons are shown whose periphery is part of the loci of the saturation magnetization for $\omega_r = 0$. FIG. 3 applies for negative anisotropy and FIG. 4 for positive anisotropy. Close to both polygons are drawn the contours which correspond to an arbitrary but different from zero small value of $\omega_r$, the accepted tolerance, $\epsilon$. The accuracy requirements are less tight in the close neighborhood of the polygon vertex, that is, in both cases, close to the axis of hard magnetization, i.e. close to a [100] axis for a material with negative anistropy and close to a [111] axis for a material with positive anistropy. The most critical misalignment is found along the polygon diagonals, that is, in both cases, close to the intersection of (110) planes. By defining in these planes the tolerated error in orientation, acceptable performance in the worst case is insured. Therefore, it is preferable to orient the rotational axis of the flat, rotationally symmetrical body with or parallel to an axis of hard magnetization.

(b) Effects of Demagnetization

The demagnetizing effects were not considered in the above discussion which was therefore applicable only to an infinite ferrimagnetic medium. For practical purposes the resonance frequency must be related to the external field applied to the resonator body.

In order to establish the magnitude and direction of the applied magnetic field necessary for resonance at low frequencies, the shape and the position of the ferrimagnetic body must be taken into consideration. The case of an ellipsoid with rotational symmetry will be considered as an example. Denoting the longitudinal demagnetizing coefficient by $N_L$ and the transverse demagnetizing coefficient by $N_T$, $2N_T + N_L = 1$ is obtained. The tensor N is diagonal with respect to the coordinate system whose axes coincide with the main axes of the ellipsoid. In the previously defined system, determined by the crystal structure, the rotation axis has the spherical coordinates $\theta_r$, $\phi_r$. Under these circumstances, the demagnetization tensor in the crystal system of coordinates can be calculated. The fundamental equation relating the magnetization and the magnetic field, $$d\vec{M}/dt = -j\vec{M} \times \vec{H}. \qquad \text{(Expression 25)}$$

can be solved, taking into consideration the various components (both dc and rf) of the magnetization and of the field, yielding $$\vec{M} = \vec{M}_o + \vec{m}$$

$$\vec{H} = \vec{H}_o + \vec{h}. \qquad \text{(Expression 26)}$$

where $\vec{m}$ and $\vec{h}$ are small, harmonic signals. Continuing, $$\vec{H}_o = \vec{H}_{app} - [N]4\pi\vec{M}_o + \vec{H}_{AO}$$

$$\vec{h} = \vec{h}_{rf} - [N]4\pi\vec{m} + \vec{h}_{AO}. \qquad \text{(Expression 27)}$$

with $H_{AO}$ and $h_A$ being the dc and time varying components of the anisotropy field, and [N] the demagnetizing tensor. $\vec{H}_{app}$ is the applied dc field, created by external sources. Introducing Expressions 26 and 27 into Expression 25 and solving for $\vec{m}$ as a function of $\vec{h}_{rf}$, the resonance condition is obtained by equating the determinant of the linear system to zero, which gives, $$\omega^2 = \gamma^2[H_o-(q_y-N_{yy})4\pi M_o][H_o-(p_x-N_{xx})4\pi M_o]-p_yM_o^2 \quad \text{(Expression 28)}$$

where $p_x$, $p_y$, $q_y$ are functions of $\theta$ and $\phi$, the orientation of the magnetization vector with respect to the crystal axes whose expressions are given in *Sodha and Srivastava*, above, and $N_{ss}$, $N_{yy}$ are components of the tensor [N] depending on the angles $\theta_r$, $\phi_r$ which describe the position of the ellipsoid.

The resonance frequency can now be calculated for a given orientation of the magnetization and a given value of the effective dc field $H_o$ parallel to it. Further, the magnitude and orientation of the applied dc field, $$\vec{H}_{app} = \vec{H}_o + [N]4\pi\vec{M}_o - \vec{H}_{AO}, \quad \text{(Expression 29)}$$

can also be calculated. The relationship between an arbitrary external field and the resonance frequency is thus established implicitly.

For the case when both the effective field and the rotation axis of the ellipsoid are parallel to the [100] axis (the desirable condition for achieving a low frequency resonance with a negative anisotropy material), $$\omega_r\gamma[H_{app}-2|K_1|/M_o-(N_z-N_t)4\pi M_o=\gamma\cdot[H_o-2|K_1|/M_o+N_t4\pi M_o]. \quad \text{(Expression 30)}$$

The low frequency operation (theoretically zero) requires a very small value of $N_t4\pi M_o$, which is obtained with a material having a low saturation magnetization shaped generally as a disk or ellipsoid, etc. Under these circumstances, all the conclusions derived in considering the effects of anisotropy above are valid with a corrected value of the effective field $(H_o+N_t(4\pi M_o)$ instead of $(H_o)$.

Conclusion

According to the invention, single-crystal ferrimagnetic materials for use as resonator bodies are specially shaped and oriented with respect to well-defined crystallographic directions and relative to the external magnetic field to avoid the low frequency limitations due to the anisotropy of the ferrimagnetic material.

In accordance with one aspect of the invention, a body for a magnetically tunable resonator is provided, which is generally flat and is generally rotationally symmetrical with respect to an axis of rotation. The body comprises a single-crystal ferrimagnetic material and is configured so that said axis of rotation is oriented with respect to the crystalline lattice of the ferrimagnetic material parallel to a (100) plane for a material with a negative anisotropy, and parallel to a (110) plane inside the acute angle formed by two [111] axes for a material with a positive anistropy.

The body may be provided with or without a generally centralized hole therethrough and the body may be shaped as generally described herein.

A resonator according to the invention using such a body includes means for coupling a signal to and/or from the body and means for applying a dc magnetic field to the body oriented parallel to the axis of rotation of the rotationally symmetrical body.

Coupling arrangements and a properly aligned dc field thus enable the resonator bodies to be used as resonators.

Single and mult-stage resonators are provided in accordance with the invention.

Such resonators can be tuned by means of a dc current between about 50 MHz and several thousand MHz. Wideband tunable resonators can according to the invention be used, for example, as resonators for oscillators or filters which are then continuously tunable from as low as 50 MHz to several thousand MHz.

When used in bandpass and band reject filters, the filters exhibit low insertion loss, predictable Q, a relatively high limiting level, and a reasonably clean resonance curve indicating a small influence of higher order modes.

For use in filters, coupling arrangements are employed which produce tight magnetic coupling between an external circuit and the ferrimagnetic resonators at frequencies as low as 50 MHz for low insertion loss at resonance.

The above and other objects, features, aspects and advantages of the present invention will be more readily perceived from the following description of the preferred embodiments thereof when considered with the accompanying drawings and appended claims.

BRIEF DESCRIPTION OF THE DRAWINGS

The present invention is illustrated by way of example and not limitation in the figures of the accompanying drawings in which like numerals indicate similar parts and in which:

FIG. 9 is a perspective top view of a single stage bandpass filter, in accordance with the invention, using a disk-shaped ferrimagnetic resonator body without a center hole, and including a coupling arrangement in which the input coupling extends around the output coupling for less input coupling than output coupling;

FIG. 10 is a side view of the filter shown in FIG. 9 with the input transmission line omitted for clarity;

FIG. 11 is a schematic circuit diagram of the filter shown in FIGS. 9 and 10;

FIG. 13 is a top view of a single stage bandpass filter, in accordance with the invention, using a disk-shaped ferrimagnetic resonator body with a center hole, including still another coupling arrangement;

FIG. 14 is a top view of a single stage bandpass filter, in accordance with the invention, using a disk-shaped ferrimagnetic resonator body with a center hole, and including a coupling arrangement in which the input and output couplings are identical;

FIG. 15 is a top view of a tunable equivalent parallel-resonant circuit, in accordance with the invention, using a disk-shaped ferrimagnetic resonator body with a center hole, and including a coupling arrangement;

FIG. 16 is a top view of a band reject filter, in accordance with the invention, using a disk-shaped ferrimagnetic resonator body with a center hole, and including a coupling arrangement;

FIG. 17 is a schematic circuit diagram of a two stage bandpass filter, in accordance with the invention, which can comprise two disk-shaped resonator bodies each with coupling arrangements as shown in FIGS. 5 an 6.

DESCRIPTION OF THE PREFERRED EMBODIMENTS

Although description herein of resonators has been limited to their use in filters, and to a resonator, per se, as a resonant parallel circuit, the invention is not so limited and is applicable to the use of resonators in oscillators, amplifiers, and other tunable devices. Moreover, while description of filters herein has largely been made with respect to single-stage filters, the invention is applicable to multi-stage filters and devices which are constructed by cascading two or more single stage filters or resonators under one pole piece, similar to the construction of multi-stage YIG bandpass filters.

Figure 1:
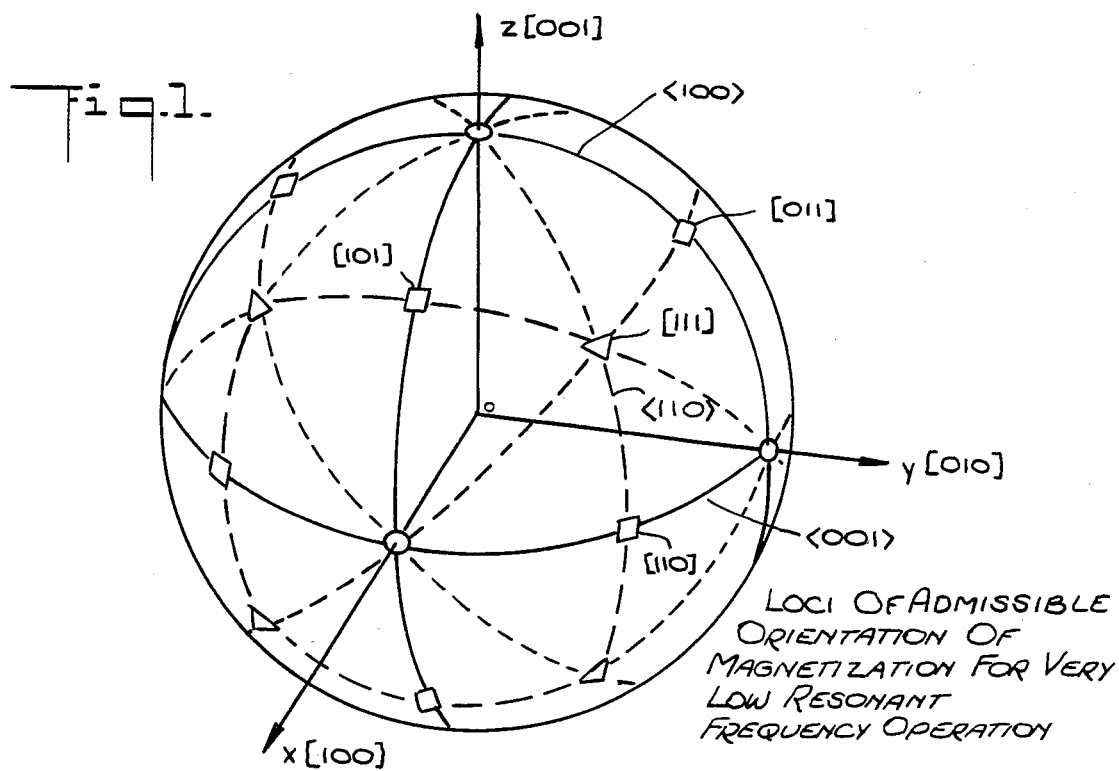
FIG. 1 is a plot of loci of admissible orientation of magnetization for very low resonance frequency operation in which full lines are for negative anisotropy and dashed lines are for positive anisotropy.
Figure 2:
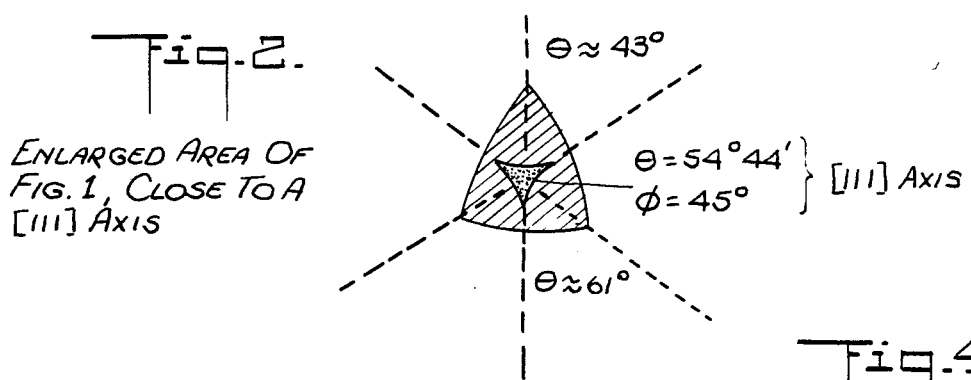
FIG. 2 is a plot of the range of possible orientations of the magnetization close to the "hard" axis for materials with positive anisotropy.
Figure 3:
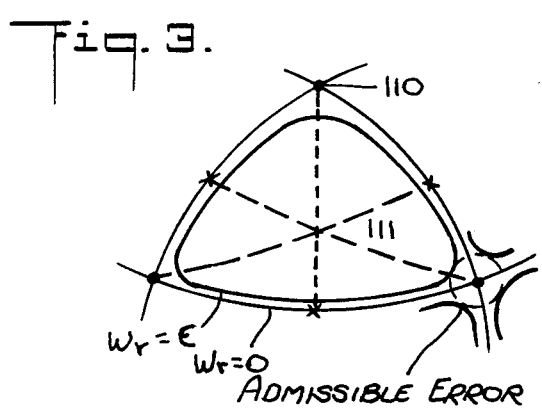
FIG. 3 is a plot of tolerances in the orientation of the dc field with respect to the crystal axes for negative anisotropy.
Figure 4:
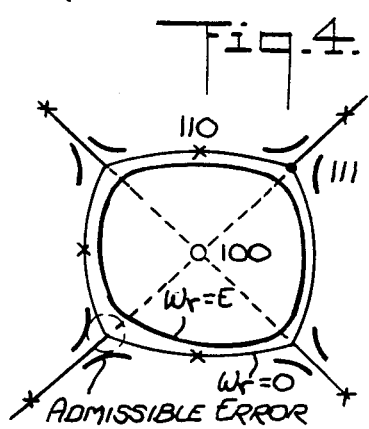
FIG. 4 is a plot of tolerances in the orientation of the dc field with respect to the crystal axes for positive anisotropy.
Figure 5:
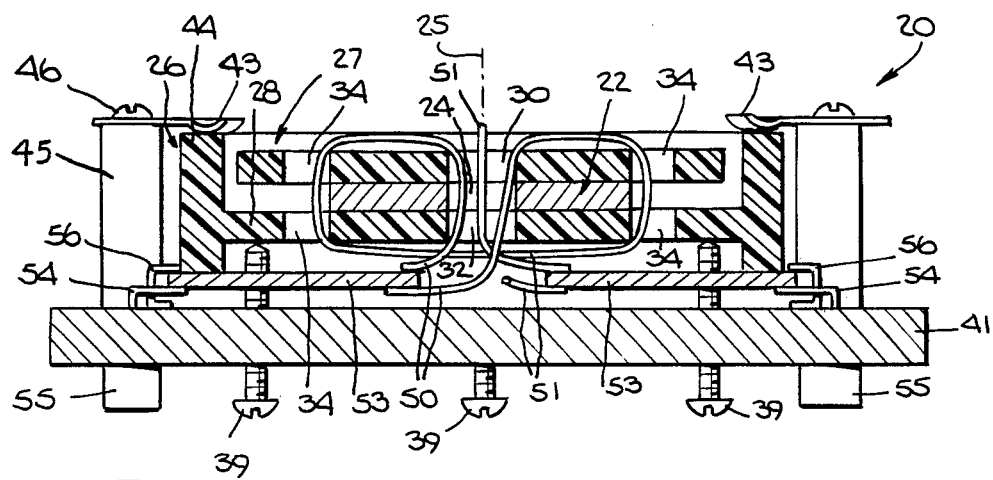
FIG. 5 is a side, cross-section view of a single stage bandpass filter, in accordance with the present invention, using a disk-shaped ferrimagnetic resonator body with a center hole, and including a coupling arrangement.
Figure 6:
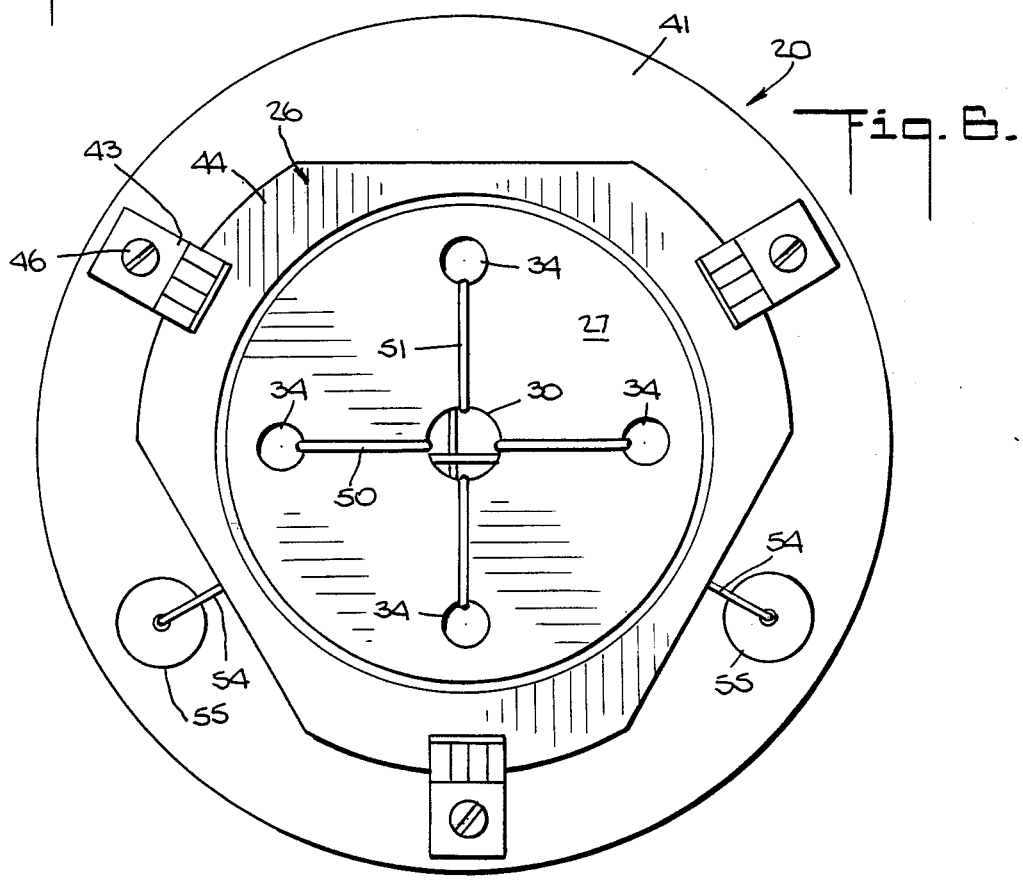
FIG. 6 is a top view of the filter of FIG. 5.

Referring now to FIGS. 5 and 6, a single stage rf bandpass filter 20 is depicted. The filter 20 utilizes a resonator body 22 of single-crystal ferrimagnetic material in the general shape of a disk having a central hole 24. The disk-shaped body 22 has a central or rotation axis 25 extending axially through the center of the body, i.e. through the center of hole 24. The axis 25 is oriented with respect to the ferrimagnetic material parallel to a (100) plane for a material with a negative anisotropy, and parallel to a (110) plane inside the acute angle formed by two [111] axes for a material with a positive anisotropy. The particular ferrimagnetic material used is not critical and can be any of those used heretofore, for example, a YIG material, preferably doped with gallium.

Figure 8:
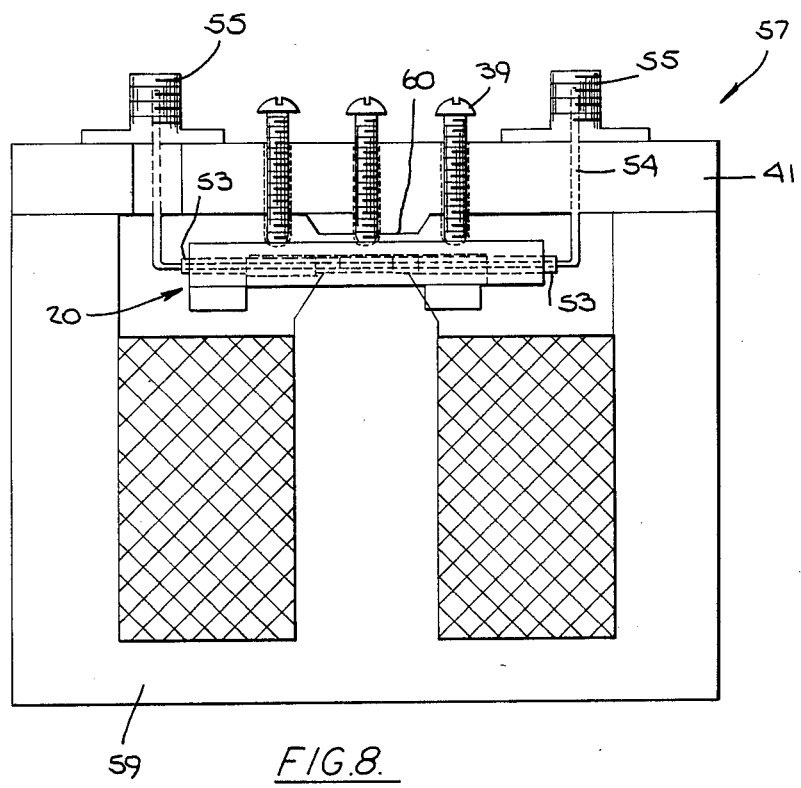
FIG. 8 is a side view in section of a tunable-single-stage bandpass filter, in accordance with the invention, including a disk-shaped ferrimagnetic resonator body with a center hole having the coupling arrangement shown in FIGS. 5–6, and including a magnetic circuit and means for aligning the resonator body.

The disk-shaped body 22 is disposed in a cup-like base 26 sandwiched between a spacer 27 and a bottom portion 28 of the cup-like base 26. Both the cup-like base 26 and the spacer 27 are made of non-magnetic, non-conductive materials (e.g. plastic, ceramics, etc.). The spacer 27 and the bottom portion 28 of the base 26 have central holes (30 and 32, respectively) aligned with the hole 24 in the disk-shaped body 22 an four holes 34 symmetrically located adjacent the circumference of the disk-shaped body. The base 26 is supported at its bottom portion 28 by three set-screws 39 over a metal end-cap 41 and kept in place by three springs 43 urging the base against the set-screws. The springs 43 bear against a peripheral or rim portion 44 of the base 26 and are fixed to posts 45 by screws 46 which also secure the posts to the end-cap 41. This arrangement makes possible the adjustment of the orientation of the rotational axis of the disk-shaped resonator body with respect to the dc field. The filter assembly including the base and end-cap is supported in a housing as shown in FIG. 8 rotated 180° from the position shown in FIG. 5.

Wound in toroidal fashion around the ferrimagnetic disk-shaped body 22, the spacer 26 and the bottom portion 28 of base 26 are two coil windings 50 and 51. The windings pass through the aligned central holes (30, 24, 32) and through the four peripheral holes 34 in the spacer and the bottom portion of the base. Each coil winding comprises two halves connected in series, wound diametrically around opposite sides of the disk-shaped body. Each winding half contains the same number of turns (one or more) and the direction of winding is the same for both halves. In this way, rf current flowing through each coil winding creates along the axes of the two halves magnetic fields which are equal in magnitude and parallel, approximating the overall uniform field required for the uniform precession mode of resonance of the disk-shaped body 22. The two coil windings 50 and 51 lie in diametric planes perpendicular to one another. The coil windings are connected, through sections of micro-strip-line 53 to the center conductor 54 of rf connectors 55, and to the metal endcap 41, which is ground, by members 56. The coil windings provide equal coupling and are reversible. Either winding can constitute an input coupling while the other constitutes an output coupling, and the connectors can therefore be used as reversible inputs and outputs of the filter.

Figure 7:
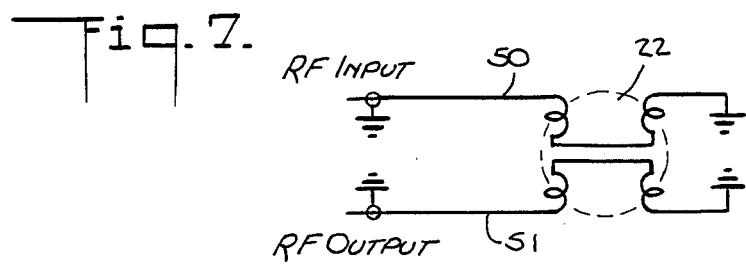
FIG. 7 is a schematic circuit diagram of the single-stage bandpass filter shown in FIGS. 5 and 6.

FIG. 7 shows schematically the electrical connection of the coil windings 50 and 51 from the central conductor 54 of a respective connector 55 to ground, after being wound about the ferrimagnetic disk-shaped body.

The axial hole 24 in the disk-shaped body 22 improves the resonator frequency characteristic (by decreasing spurious responses) and makes possible tighter input and output coupling. An optimum diameter for the hole has been found to be about $\frac{1}{8}$ to about $\frac{1}{4}$ of the diameter of the disk-shaped body itself. With the axial hole 24, the disk-shaped body may, for purposes of discussion, be considered a toroid. A flat ellipsoidal shape is preferred, and in order to more closely approximate flat ellipsoidal shapes, the peripheral edges of a disk-like body may be bevelled, and if a central hole is provided, the edges of the hole may also be bevelled. Resonator performance can be improved by such bevelling and shaping of the resonator body, as described more fully below.

By way of example, the outer diameter of the ferrimagnetic disk-shaped body can be about 0.180 inch and the diameter of the central hole can be about 0.040 inch. The thickness of the disk-shaped body can be about 0.08 inch.

The rf current flowing through the input coil winding produces the uniform rf magnetization necessary for a uniform precession of the magnetic dipoles inside the single-crystal toroid, assuming that the dc field in which the toroid is located is also uniform. At the magnetic resonance frequency (the frequency of the rf current flowing in the two input winding halves, with the dc field strength properly adjusted so that this rf frequency is equal to the magnetic resonance frequency), this precession gets very large which means that the component of the rf magnetization which is parallel to the toroid will rotate with time at the rf frequency. In order to produce an induced output current, an identical coil is wound on the same toroid. For maximum decoupling, the best position for the output coil is in a plane which is at 90° to the plane of the input coil. That means that at any frequency other than at resonance where there is essentially no rf magnetization parallel to the axis of the output coil winding, the coupling between the input winding halves and the output winding halves is very small, and a high filter isolation is achieved.

The input and output coil windings can be wound in many alternative ways. Instead of the toroidal windings described above, the input and output windings can comprise single loops wound around the whole diameter of the disk-shaped body (in which case the body may not have an axial hole). In addition, the number of turns may vary and the turns of each coil winding can be connected in series, parallel or both. The windings should be executed in such a way that the current flowing through a coil has the same direction for all the conductors located on the same side of the disk-shaped body and thus create a magnetic field with the same orientation and magnitude in all the points of the disk-shaped body, as discussed above. This insures the decoupling of the two perpendicular coils outside the resonance conditions.

In FIG. 8 a complete filter 57 is illustrated. The dc magnetic field is induced by an electromagnet 59 in whose gap 60 the entire filter 20 depicted in FIGS. 5–6 is located. The field can thus be controlled in known manner by the dc current supplied to the electromagnet. The field is essentially normal to the generally flat surface of the disk-shaped body, but a certain degree of adjustment of the position of the disk-shaped body is necessary to provide for an accurate alignment of the crystalographic axes of the crystal in the field. Even slight misalignments can significantly degrade the resonator's performance at low frequency. With presently used ferrimagnetic materials, alignment of the crystallographic axes is somewhat critical and should be normal to within about one degree of the direction of the field. Thus, for presently used ferrimagnetic materials, the central axis of the disk-like resonator body should be aligned with the crystallographic axes with similar accuracy to facilitate proper alignment of the resonator body in the field.

Ferromagnetic resonance theory shows that besides the uniform precession mode, a large number of additional resonance modes are possible, whose frequencies—especially for a disk-shaped body—are concentrated in a narrow frequency range. See B. Lax and K. Button "Microwave Ferrites and Ferrimagnetics" pages 180–188. If the rf field created by the input coupling arrangement produces a perfectly uniform (constant) rf field inside the ferrimagnetic disk-shaped body (toroid), and at all places perpendicular to the internal magnetic dc field which is assumed constant at any place, only one resonance frequency can occur. If, however, the rf field is not uniform in the resonator body, and the dc field is also not uniform, additional rf field and dc field configurations are superimposed upon each other to produce the actual rf and dc fields distributions. Each of these particular field configurations in turn has its own resonance frequency which is considered "spurious" to the fundamental resonance frequency. The strength of each resonance is measured by the insertion loss of the device at the respective spurious resonance frequency. Some of these spurious resonance frequencies change at a different rate with the internal dc field than the fundamental resonance, and therefore, can actually cross over the fundamental resonance when the dc field is changed, causing perturbations of the fundamental resonance curve. The depths of these spurious responses are also a measure of the strength of the spurious resonances. It is possible that many of these spurious resonances are so close together near the main resonance, that the resonance curve of a bandpass filter is altered considerably.

The reduction of the strength of these spurious resonances has been achieved experimentally for the ferrimagnetic disk-shaped resonator body of FIG. 5 by changing the diameter of the center hole of the disk-shaped body, by bevelling the edges of the disk-shaped body, by changing the disk-shaped body's outside diameter to thickness ratio, etc., and by arranging the input and output coupling winding arrangements to create an rf field as uniform as possible inside the disk-shaped resonator body. Furthermore, the strength of the dc field can be varied across the resonator body by changing the pole tip configuration in order to change the distribution and the strength of these spurious resonances, until a satisfactory resonance curve versus frequency is obtained.

The filter of FIGS. 5–8 utilizing a gallium doped YIG material is tunable from about 50 MHz to more than 2.0 GHz. At lower frequencies of, for example, about 200 MHz, signal limiting occurs at signal levels in excess of 0dbm and the tolerable power level becomes higher for higher frequencies. Frequency response and limiting levels will, however, vary with the particular material used.

Referring now to FIGS. 9–11, a single stage bandpass filter 70 is depicted which includes a resonator disk-shaped body 72 shown without a central hole, although a disk-shaped body with a central hole can be used. The input and output coupling conductors 74, 75 are wound across the entire disk-shaped body and not in toroidal fashion as in the embodiment of FIGS. 5–6. The disk-shaped resonator body 72 is supported on a base 77 comprising a non-conducting, non-magnetic core 79 and a conducting layer 81 (e.g. copper) secured to the top side thereof. A small conducting washer 83 (e.g. copper) having a central hole 85 is soldered to top conducting layer 81. Washer 83 assures that the top layer 81, which is grounded, and the wound portion of the input conductor which is disposed over the hole 85 do not contact each other. The disk-shaped resonator body 72 is sandwiched between two non-conducting plates (e.g. glass) 87, 88. In order to separate the wound portion of the input conductor from the wound portion of the output conductor, non-conducting strips (e.g. alumina) 90 are secured to the top of plate 87 at opposite outer edges thereof and similar strips 91 are secured to the bottom of plate 88 at opposite outer edges thereof. The strips 90 and 91 are superposed along like edges of the plates and the input coupling conductor 74 is wound around the entire assembly. One end of the input conductor 74 is soldered to the inner conductor 93 of the input transmission line 92 and the other end is soldered to the outer conductor 94 (grounded) of the input transmission line. The input coupling conductor is wound around the assembly evenly spaced apart to create a uniform rf field in the area in which the disk-shaped body 72 is located. In the embodiment depicted in FIG. 9, the input coupling conductor includes three turns. The actual number of turns, however, will depend on the frequency range, insertion loss, and bandwidth desired.

The output coupling conductor 75 is similarly wound except that it is wound directly around the plates 87, 88 in closer proximity to the disk-shaped body 72, which provides a tighter magnetic coupling to the body than that of the input coupling conductor. One end of the output coupling conductor 75 is soldered to the outer conductor 96 (grounded) of the output transmission line 98 while the other end is soldered to the inner conductor 100 of that transmission line. In FIG. 10, the rf input transmission line has been omitted for clarity.

FIG. 11 is a schematic circuit diagram of the filter of FIGS. 8–9, from which it can be seen that the filter is a single-stage bandpass filter.

For the embodiment of FIGS. 9–10, the washer can have a thickness of about 0.20 inch, the plates 87, 88 can have a thickness of about 0.005 inch and the strips 90, 91 can be 0.010 inch thick and 0.050 inch wide. The disk-shaped resonator body can have dimensions as described for the body of FIGS. 5–6.

Figure 12:
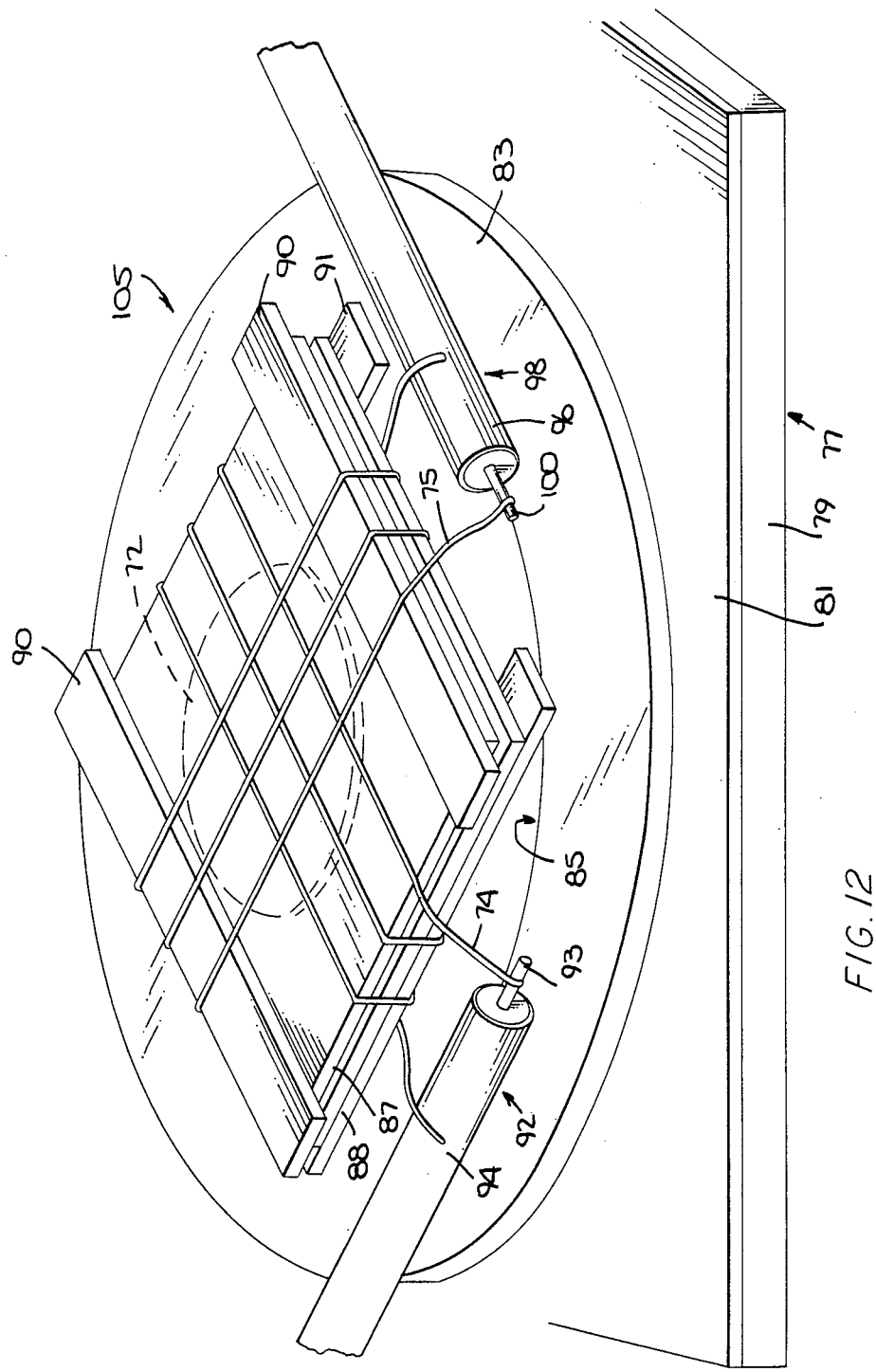
FIG. 12 is a top perspective view of a single stage bandpass filter, in accordance with the invention, using a disk-shaped ferrimagnetic resonator body without a center hole, including a coupling arrangement in which the input and output couplings are arranged for equal input and output coupling.

Referring now to FIG. 12, a bandpass filter 105 similar to the filter embodiment of FIGS. 9–10 is depicted. In the filter 105, the input and output coupling windings are arranged in such a way as to obtain the same coupling factor for the input coupling conductor 74 and the output coupling conductor 75. The input and output of the filter 105 are therefore reversible. This is accomplished by providing strips 90 on the top and bottom of the plates 87 and 88, respectively, but with the strips 90 offset in position from the strips 91. The input coupling conductor 74 is wound around the two plates 87, 88 and the lower two strips while the output coupling conductor 75 is wound around the two plates 87, 88 and the upper two strips.

Another embodiment of a single stage bandpass filter 115 using a disk-shaped resonator body 22 with a center hole 24 is depicted in FIG. 13. In the embodiment of FIG. 13, the coupling arrangement differs from that of FIGS. 5–6. One end of the input coupling conductor 117 is connected to the inner conductor of the input transmission line 92; the central portion of the conductor 117 is secured (e.g. by epoxy) to the top of the disk-shaped body extending about a portion of a circle; and the other end of the conductor is soldered to the top conductive layer 81 (grounded) of the base 77. The output conductor 119 is wound around the disk-shaped body through the hole with one end soldered to grounded conductive layer 81 and the other connected to the inner conductor of the output transmission line 98. The filter 115 exhibits a wider bandwidth and larger insertion loss than the filter of FIGS. 5–6. The disk-shaped body 22 is supported on the base by non-conducting, non-magnetic strips 121, 122. The input conductor 117 constitutes a partial loop coaxial with the disk-shaped body. When rf current flows along it, it creates a magnetic field which, in the disk-shaped body, is oriented radially. At resonance, an azimuthal component of the rf magnetic field appears, and it causes a current to flow in the output conductor. At other frequencies, the input and the output conductors are decoupled.

FIG. 14 illustrates a filter 125 similar to that of FIG. 13 in which the input and output coupling conductor arrangement for both input and output conductors 127, 128 is similar to the output coupling conductor winding 119 in the FIG. 13 embodiment. The coupling arrangement operates as a transformer, and the resonant effect which enables operation as a tunable filter is the significant increase in the magnetic susceptibility, which causes a strong coupling from input to output to occur only close to the resonance frequency. The input and output are also reversible in filter 125.

Referring now to FIG. 15, an embodiment of a resonator 130 is depicted. The resonator 130 includes a ferrimagnetic resonator body 22 of disk shape with a central hole 24 coupled to an input transmission line 92 by means of a coil winding 132 toroidally wound, as described for FIGS. 5–6 with respect to the coil windings 50 and 51, with a convenient number of loops connected in series or parallel. The function of this circuit is that of a tunable parallel resonance circuit. Out of resonance, the coil impedance is very small compared to the characteristic impedance of the input line and the resonator behaves essentially like a short circuit. Such a circuit can be used as part of a magnetically tunable broadband oscillator.

Referring now to FIG. 16, a tunable, single-stage bandstop or band reject filter 135 is depicted which is tunable over the same frequency range as the single-stage bandpass filter of FIGS. 5–6. The coupling coil winding 137 is connected between the input and the output inner conductor of the input and output coaxial lines 92 and 98. It is toroidally wound around two disk sections diametrically opposite to one another (similar to the coil windings 50 and 51 in FIGS. 5–6), with a given number of turns in series or parallel, arranged conveniently in order to set up a uniform rf field in the disk-shaped ferrimagnetic resonator body 22, as described above. Again, the principle of a high magnetic susceptibility and high losses close to resonance describes the operation of the bandstop filter. At off-resonance frequencies, the impedance of the series inductance is very small over the entire frequency tuning range. At resonance, the equivalent impedance becomes very high causing a large insertion loss ("notch") in frequency response.

FIG. 17 illustrates the equivalent circuit of a two stage bandpass filter 140, which comprises two cascaded resonators, for example two resonators 20 as depicted in FIGS. 5–7 cascaded together by connecting the output 51A of a first resonator 20A in series with the input of a second resonator 20B. Interstage couplng, per se, is achieved in known manner.

Certain changes and modifications of the embodiments of the invention dislcosed herein will be readily apparent to those skilled in the art. For example, theory has been developed herein for presently used ferrimagnetic materials. However, the theory and invention disclosed herein may be applicable to other materials with (or without) modifications in theory and material structure which can be readily perceived from the disclosure herein. It is the applicants' intention to cover by their claims all those changes and modifications which could be made to the embodiments of the invention herein chosen for the purpose of disclosure without departing from the spirit and scope of the invention.

What is claimed is:

1. A magnetically tunable resonator comprising a body and means for applying a dc magnetic field to the body, the body being generally flat and being generally rotationally symmetrical with respect to an axis of rotation, the body comprising a single crystal ferrimagnetic material and being configured so that said axis of rotation is oriented in a specific manner with respect to the lattice of said single crystal ferrimagnetic material, the orientation of said axis with respect to said lattice being parallel to a (100) plane for a material with a negative anisotropy, and parallel to a (110) plane inside the acute angle formed by two [111] axes for a material with a positive anisotropy, the dc magnetic field applying means and the body being oriented with respect to each other so that the dc magnetic field applying means applies the dc magnetic field to the body parallel to said axis of rotation, the body having a variable resonance frequency selectable by the dc magnetic field, and the dc magnetic field applying means being adjustable so as to apply a dc magnetic field to the body to cause it to resonate at a selected resonance frequency.

2. The resonator according to claim 1 wherein the body has a generally centralized hole therethrough.

3. The resonator according to claim 1 including means for coupling a signal to and/or from the body.

4. The resonator according to claim 3 wherein the means for coupling comprises input coupling means for coupling a signal to the body and the resonator is connectable as a one port resonance circuit.

5. The resonator according to claim 3 wherein the coupling means comprises input coupling means for coupling a signal to the body and output coupling means for coupling a signal from the body, and the resonator is connectable as a two port resonance circuit.

6. The resonator according to claim 5 wherein the input coupling means and the output coupling means each comprise a separate conductor disposed adjacent the body in a signal coupling relationship therewith, the two conductors extending generally perpendicular to each other and substantially not being directly coupled to each other.

7. The resonator according to claim 6 wherein the body has a generally centralized hole therethrough and each of said conductors is wound around at least part of the body through the hole at least once on one side of the hole and at least once on a side of the hole generally opposite to the one side.

8. The resonator according to claim 5 wherein the body has a generally centralized hole therethrough, one of the coupling means comprising a conductor disposed adjacent a surface of the body in a signal coupling relationship therewith extending generally along part of a circle centered at the axis of rotation of the body and the other of the coupling means comprising a conductor wound at least once around at least part of the body through the hole.

9. The resonator according to claim 5 wherein the body has a generally centralized hole therethrough, one of the coupling means comprising a conductor wound around at least part of the body through the hole at least once at one location and the other of the coupling means comprising a conductor wound around at least part of the body through the hole at least once at a location diametrically opposite to the one location.

10. The resonator according to claim 5 wherein the input coupling means and the output coupling means comprise a common conductor having an input portion, an output portion and a coupling portion connected between the input and output portions, the coupling portion extending adjacent the body in a signal coupling relationship therewith.

11. The resonator according to claim 10 wherein the body includes a generally centralized hole therethrough and the coupling portion of the common conductor extends through the hole and is wound around at least part of the body located to one side of the hole and around at least part of the body located at a side of the hole generally opposite to the one side.

12. A magnetically tunable bandpass filter comprising one or more resonators according to claim 5 wherein the coupling means for each resonator is configured so as to allow substantial transfer of a signal from the input coupling means to the output coupling means at signal frequencies close to the resonance frequency of each respective resonator body.

13. A magnetically tunable bandstop filter comprising one or more resonators according to claim 5 wherein the coupling means for each resonator is configured so as to allow substantial transfer of a signal from the input coupling means to the output coupling means except for signal frequencies close to the resonance frequency of each respective resonator body.

14. A magnetically tunable resonator comprising a body and means for applying a dc magnetic field to the body, the body being generally flat and being generally rotationally symmetrical with respect to an axis of rotation, the body comprising a single crystal ferrimagnetic material and being configured so that said axis of rotation is oriented in a specific manner with respect to the lattice of said single crystal ferrimagnetic material, the orientation of said axis with respect to said lattice being parallel to a (100) plane and in proximity to a [100] axis for a material with a negative anisotropy, and parallel to a (110) plane inside the acute angle formed by two [111] axes and in proximity to a [111] axis for a material with a positive anistropy, the dc magnetic field applying means and the body being oriented with respect to each other so that the dc magnetic field applying means applies the dc magnetic field to the body parallel to said axis of rotation, the body having a variable resonance frequency selectable by the dc magnetic field, and the dc magnetic field applying means being adjustable so as to apply a dc magnetic field to the body to cause it to resonate at a selected resonance frequency.

15. The resonator according to claim 14 wherein the body has a generally centralized hole therethrough.

16. The resonator according to claim 14 including means for coupling a signal to and/or from the body.

17. The resonator according to claim 16 wherein the means for coupling comprises input coupling means for coupling a signal to the body and the resonator is connectable as a one port resonance circuit.

'18. The resonator according to claim 16 wherein the coupling means comprises input coupling means for coupling a signal to the body and output coupling means for coupling a signal from the body, and the resonator is connectable as a two port resonance circuit.

19. The resonator according to claim 18 wherein the input coupling means and the output coupling means each comprise a separate conductor disposed adjacent the body in a signal coupling relationship therewith, the two conductors extending generally perpendicular to each other and substantially not being directly coupled to each other.

20. The resonator according to claim 19 wherein the body has a generally centralized hole therethrough and each of said conductors is wound around at least part of the body through the hole at least once on one side of the hole and at least once on a side of the hole generally opposite to the one side.

21. The resonator according to claim 18 wherein the body has a generally centralized hole therethrough, one of the coupling means comprising a conductor disposed adjacent a surface of the body in a signal coupling relationship therewith extending generally along part of a circle centered at the axis of rotation of the body and the other of the coupling means comprising a conductor wound at least once around at least part of the body through the hole.

22. The resonator according to claim 18 wherein the body has a generally centralized hole therethrough, one of the coupling means comprising a conductor wound around at least part of the body through the hole at least once at one location and the other of the coupling means comprising a conductor wound around at least part of the body through the hole at least once at a location diametrically opposite to the one location.

23. The resonator according to claim 18 wherein the input coupling means and the output coupling means comprise a common conductor having an input portion, an output portion and a coupling portion connected between the input and output portions, the coupling portion extending adjacent the body in a signal coupling relationship therewith.

24. The resonator according to claim 23 wherein the body includes a generally centralized hole therethrough and the coupling portion of the common conductor extends through the hole and is wound around at least part of the body located to one side of the hole and around at least part of the body located at a side of the hole generally opposite to the one side.

25. A magnetically tunable bandpass filter comprising one or more resonators according to claim 18 wherein the coupling means for each resonator is configured so as to allow substantial transfer of a signal from the input coupling means to the output coupling means at signal frequencies close to the resonance frequency of each respective resonator body.

26. A magnetically tunable bandstop filter comprising one or more resonators according to claim 18 wherein the coupling means for each resonator is configured so as to allow substantial transfer of a signal from the input coupling means to the output coupling means except for signal frequencies close to the resonance frequency of each respective resonator body.

* * * * *